US011854764B2

(12) United States Patent
Yasuda et al.

(10) Patent No.: US 11,854,764 B2
(45) Date of Patent: Dec. 26, 2023

(54) CHARGED PARTICLE BEAM WRITING DEVICE AND CHARGED PARTICLE BEAM WRITING METHOD

(71) Applicant: NuFlare Technology, Inc., Yokohama (JP)

(72) Inventors: Junpei Yasuda, Yokohama (JP); Naoto Wakui, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 93 days.

(21) Appl. No.: 17/654,834

(22) Filed: Mar. 15, 2022

(65) Prior Publication Data
US 2022/0301818 A1   Sep. 22, 2022

(30) Foreign Application Priority Data

Mar. 17, 2021 (JP) .................. 2021-043761

(51) Int. Cl.
*H01J 37/147* (2006.01)
*H01J 37/317* (2006.01)

(52) U.S. Cl.
CPC ........ *H01J 37/3174* (2013.01); *H01J 37/147* (2013.01)

(58) Field of Classification Search
CPC ................ H01J 37/3174; H01J 37/147; H01J 2237/30461; H01J 2237/30494; H01J 2237/31776; H01J 37/304; H01J 37/3177; G03F 7/2059; G03F 7/2061; G03F 7/70383

(Continued)

(56) References Cited

U.S. PATENT DOCUMENTS

| 5,530,250 | A | 6/1996 | Yamashita | |
|---|---|---|---|---|
| 2016/0343535 | A1* | 11/2016 | Matsui | H01J 37/1472 |
| 2021/0257185 | A1* | 8/2021 | Matsumoto | H01J 37/20 |

FOREIGN PATENT DOCUMENTS

| JP | 07-142351 A | 6/1995 |
|---|---|---|
| JP | 08-083740 A | 3/1996 |

(Continued)

*Primary Examiner* — Michael Maskell
(74) *Attorney, Agent, or Firm* — Oblon, McClelland, Maier & Neustadt, L.L.P.

(57) ABSTRACT

In one embodiment, a charged particle beam writing device writes sequentially patterns to a plurality of deflection positions on a target object by deflecting a charged particle beam by a deflector. The device includes a storage storing relation information indicating a relationship between a time elapsed since a start of deflection by the deflector and an amount of position shift in a shot position to which the charged particle beam is shot, a shot position corrector obtaining a first amount of position shift corresponding to an n-th (where n is an integer greater than or equal to 2) deflection position in sequential pattern writing and a second amount of position shift corresponding to an n−1-th deflection position by using by using a settling time and a shot time of the deflector and the relation information, obtaining an amount of position correction by adding up the first amount of position shift and the second amount of position shift, and correcting a shot position, and a writer emitting the charged particle beam to the n-th deflection position by using the shot data for which the shot position has been corrected, and writing a pattern.

9 Claims, 3 Drawing Sheets

(58) Field of Classification Search
USPC .......................................... 250/492.1–492.3
See application file for complete search history.

(56) References Cited

FOREIGN PATENT DOCUMENTS

| | | |
|---|---|---|
| JP | 2016-219577 A | 12/2016 |
| JP | 2020-021880 A | 2/2020 |
| WO | WO 2008/139569 A1 | 11/2008 |
| WO | WO 2020/026696 A1 | 2/2020 |

* cited by examiner

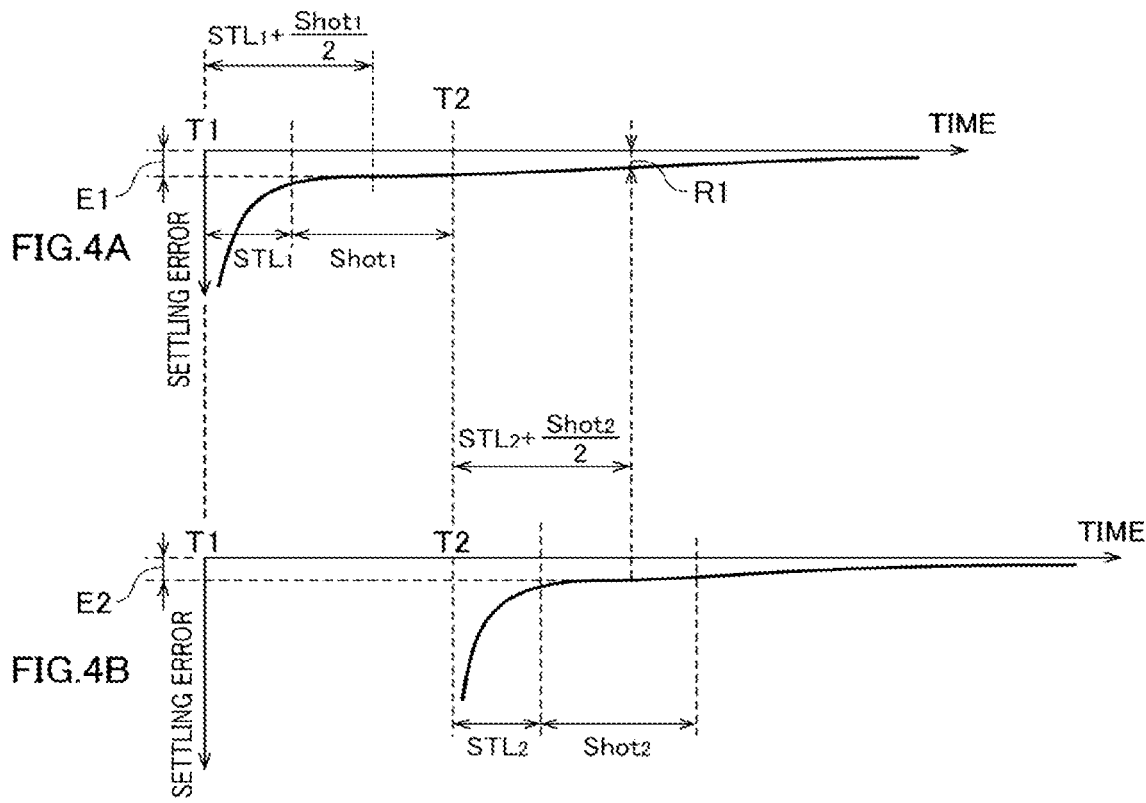
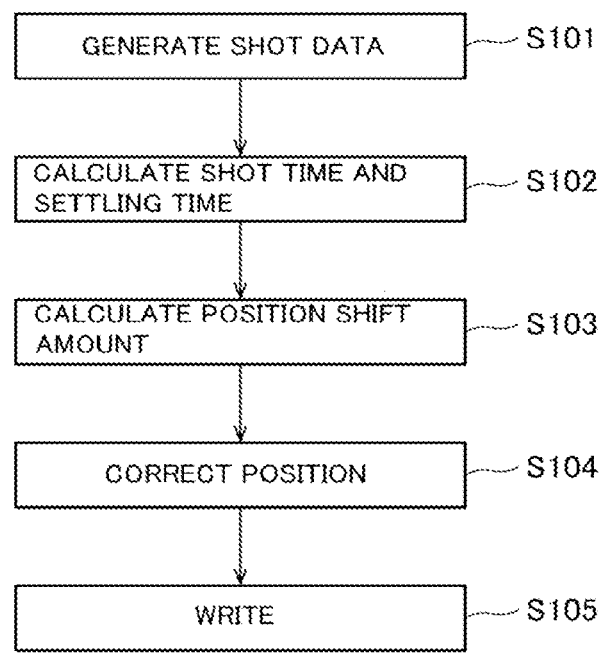

CHARGED PARTICLE BEAM WRITING DEVICE AND CHARGED PARTICLE BEAM WRITING METHOD

CROSS REFERENCE TO RELATED APPLICATION

This application is based upon and claims benefit of priority from the Japanese Patent Application No. 2021-43761, filed on Mar. 17, 2021, the entire contents of which are incorporated herein by reference.

FIELD

The present invention relates to a charged particle beam writing device and a charged particle beam writing method.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern formed on a quartz is employed. The highly precise original image pattern is written by using an electron beam writing apparatus, in which a technology commonly known as electron beam lithography is used.

Electron beam writing devices deflect an electron beam by applying a predetermined voltage to a deflector disposed along the optical path of the electron beam to write a pattern to a substrate on a stage. When the deflector is to be driven by an output voltage from a DAC (digital-analog converter) amplifier, a settling time for the output voltage corresponding to the load is necessary. An insufficient settling time causes an error in the amount of deflection movement of the electron beam and results in a decrease in precision of writing. On the other hand, an excessively long settling time results in a decrease in throughput. Therefore, it is desirable to make the settling time as short as possible without a decrease in precision of writing.

BRIEF DESCRIPTION OF THE DRAWINGS

FIG. 4A is a graph showing changes in a settling error over time for a 1st deflection region (TF), and FIG. 4B is a graph showing changes in a settling error over time for a 2nd deflection region (TF)

FIG. 5 is a flowchart illustrating a writing method according to the embodiment.

DETAILED DESCRIPTION

In one embodiment, a charged particle beam writing device is for sequentially writing patterns to a plurality of deflection positions on a target object by deflecting a charged particle beam by a deflector. The charged particle beam writing device includes a shot data generator converting write data to shot data that includes shot positions to which and shot times for which the charged particle beam is shot, a storage storing relation information indicating a relationship between a time elapsed since a start of deflection by the deflector and an amount of position shift in a shot position to which the charged particle beam is shot, a shot position corrector obtaining a first amount of position shift corresponding to an n-th (where n is an integer greater than or equal to 2) deflection position in sequential pattern writing, by using a settling time and a shot time of the deflector and the relation information, obtaining a second amount of position shift corresponding to an n-1-th deflection position by using the time elapsed since the start of deflection and the relation information, obtaining an amount of position correction by adding up the first amount of position shift and the second amount of position shift, and correcting a shot position, for the n-th deflection position, defined by the shot data based on the amount of position correction, and a writer emitting the charged particle beam to the n-th deflection position by using the shot data for which the shot position has been corrected, and writing a pattern.

In the present embodiment, as an example of a charged particle beam, a configuration using an electron beam will be described. However, the charged particle beam is not limited to an electron beam, and another charged particle beam, such as an ion beam may be used. Further, as an example of a charged particle beam device, a variable shape type writing device will be described.

Figure 1:
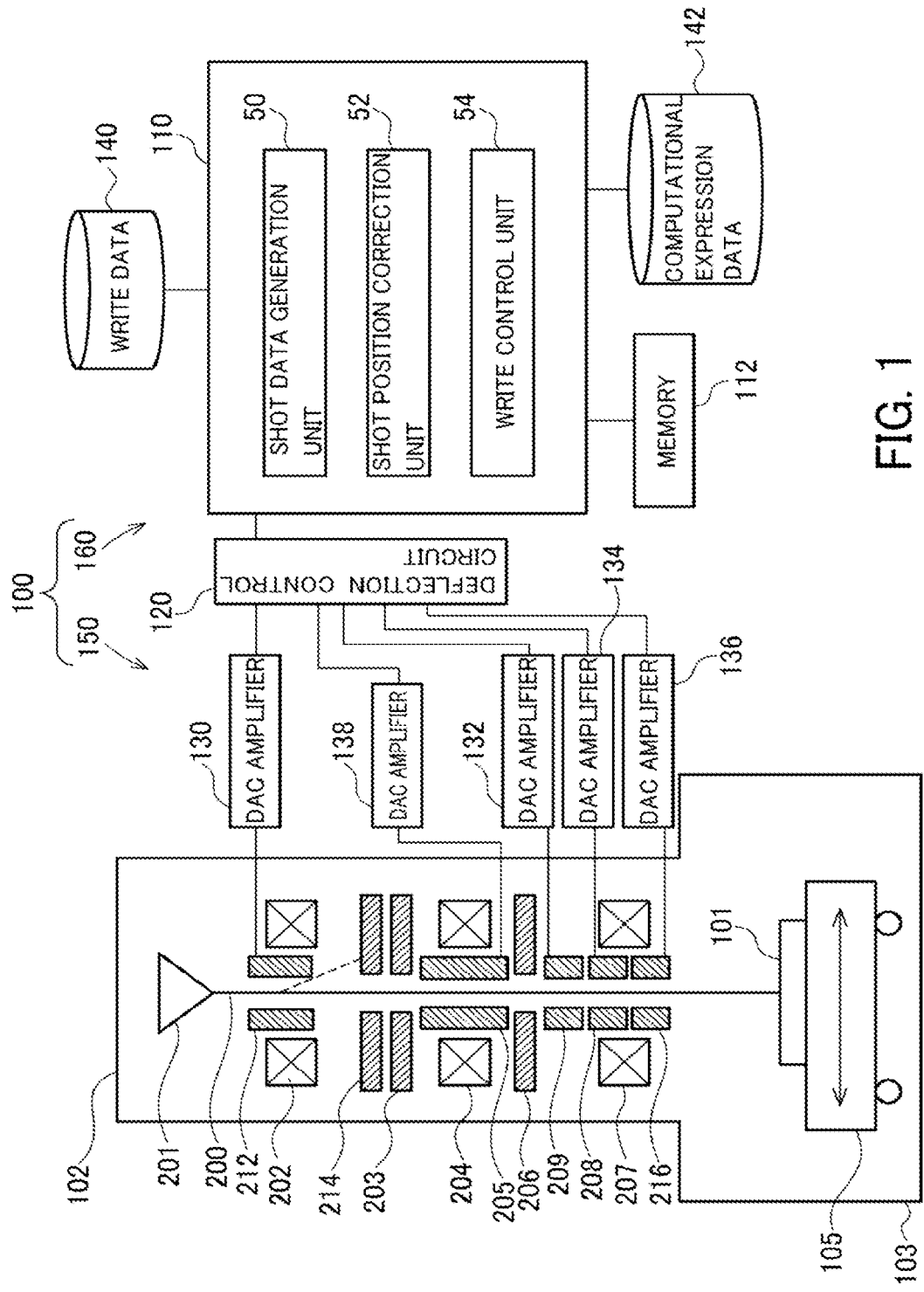
FIG. 1 is a schematic configuration diagram of a writing device according to an embodiment of the present invention.

FIG. 1 is a schematic diagram illustrating a configuration of a writing device according to an embodiment. In FIG. 1, a writing device 100 includes a writing unit 150 and a control unit 160. The writing unit 150 includes an electron column 102 and a writing chamber 103. In the electron column 102, an electron gun 201, an illumination lens 202, a blanking deflector (blanker) 212, a blanking aperture plate 214, a first shaping aperture plate 203, a projection lens 204, a shaping deflector 205, a second shaping aperture plate 206, an objective lens 207, a main deflector 208, a sub-deflector 209, and a sub-sub-deflector 216 are disposed.

In the writing chamber 103, an XY stage 105 that is movable in at least an x direction and a y direction is disposed. On the XY stage 105, a target object 101 (substrate) to which a resist is applied and that is a write target is disposed. Examples of the target object 101 include a mask for exposure and a silicon wafer used in production of semiconductor devices. Examples of the mask include mask blanks.

The control unit 160 includes a control computer 110, a memory 112, a deflection control circuit 120, a DAC (digital-analog converter) amplifiers 130, 132, 134, 136, and 138 (deflection amplifiers), and storage units 140 and 142 that are, for example, magnetic disk devices. The control computer 110, the memory 112, the deflection control circuit 120, and the storage units 140 and 142 are connected to each other via a bus not illustrated.

To the deflection control circuit 120, the DAC amplifiers 130, 132, 134, 136, and 138 are connected. The DAC amplifier 130 is connected to the blanking deflector 212. The DAC amplifier 132 is connected to the sub-deflector 209. The DAC amplifier 134 is connected to the main deflector 208. The DAC amplifier 136 is connected to the sub-sub-deflector 216. The DAC amplifier 138 is connected to the shaping deflector 205.

The control computer 110 includes a shot data generation unit 50, a shot position correction unit 52, and a write control unit 54. The functions of the shot data generation unit 50, the shot position correction unit 52, and the write control unit 54 may be configured as software or may be configured as hardware. The result of computation by the control computer 110 is stored in the memory 112 each time computation is performed.

Figure 2:
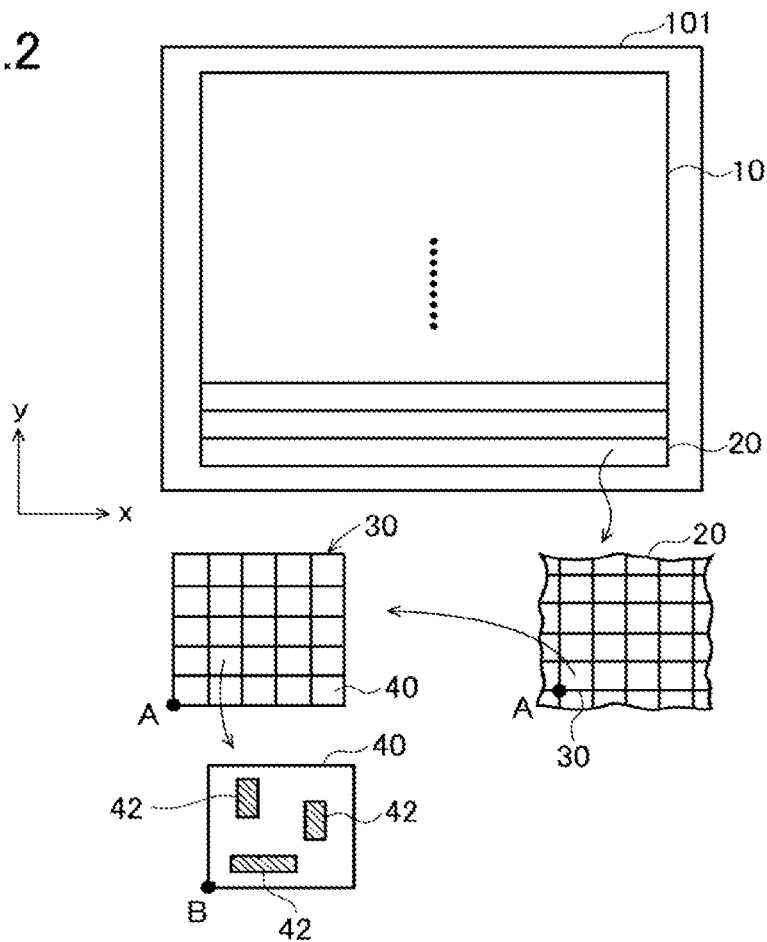
FIG. 2 is a schematic diagram for explaining deflection regions.

FIG. 2 is a schematic diagram for explaining deflection regions. In FIG. 2, a write region 10 of the target object 101 is virtually divided in, for example, the y direction, into a plurality of stripe regions 20 in rectangular strip shapes in accordance with the possible deflection width of the main deflector 208. Regions obtained by dividing, in the x direction, each of the stripe regions 20 in accordance with the possible deflection width of the main deflector 208 are deflection regions (main deflection regions) of the main deflector 208.

Each of the main deflection regions is virtually divided into a plurality of subfields (SFs) 30 in a mesh form in accordance with the possible deflection size of the sub-deflector 209. Each of the SFs 30 is virtually divided into a plurality of under-subfields (hereinafter each referred to as "TF", which is the abbreviation of Tertiary Deflection Field referring to tertiary deflection) 40 in a mesh form in accordance with the possible deflection size of the sub-sub-deflector 216.

To each of shot positions 42 in each of the TFs 40, a shot shape is written. Accordingly, deflection regions of the deflectors in three stages for deflecting an electron beam 200 include the main deflection regions, the SFs 30, and the TFs 40 in descending order of the deflection region size.

From the deflection control circuit 120 to the DAC amplifier 130, a digital signal for blanking control is output. The DAC amplifier 130 converts the digital signal to an analog signal, amplifies the analog signal, and applies the amplified analog signal to the blanking deflector 212 as a deflection voltage. The electron beam 200 is deflected by this deflection voltage to thereby perform blanking control for each shot.

From the deflection control circuit 120 to the DAC amplifier 138, a digital signal for shaping deflection is output. The DAC amplifier 138 converts the digital signal to an analog signal, amplifies the analog signal, and applies the amplified analog signal to the shaping deflector 205 as a deflection voltage. By this deflection voltage, the electron beam 200 is deflected to a specific position on the second shaping aperture plate 206 to thereby form an electron beam having desired dimensions and a desired shape.

From the deflection control circuit 120 to the DAC amplifier 134, a digital signal for main deflection control is output. The DAC amplifier 134 converts the digital signal to an analog signal, amplifies the analog signal, and applies the amplified analog signal to the main deflector 208 as a deflection voltage. By this deflection voltage, the electron beam 200 is deflected to thereby deflect the beam in each shot to a reference position A of a specific subfield (SF) (for example, a center position or a bottom left corner position of the SF) obtained by virtual division in a mesh form. In a case where writing is performed during continuous movement of the XY stage 105, the deflection voltage includes a tracking deflection voltage for following the movement of the stage.

From the deflection control circuit 120 to the DAC amplifier 132, a digital signal for sub-deflection control is output. The DAC amplifier 132 converts the digital signal to an analog signal, amplifies the analog signal, and applies the amplified analog signal to the sub-deflector 209 as a deflection voltage. By this deflection voltage, the electron beam 200 is deflected to thereby deflect the beam in each shot to a reference position B of a specific TF 40 (for example, a center position or a bottom left corner position of the TF), which is the smallest deflection region.

From the deflection control circuit 120 to the DAC amplifier 136, a digital signal for sub-sub-deflection control is output. The DAC amplifier 136 converts the digital signal to an analog signal, amplifies the analog signal, and applies the amplified analog signal to the sub-sub-deflector 216 as a deflection voltage. By this deflection voltage, the electron beam 200 is deflected to thereby deflect the beam in each shot to a corresponding one of the shot positions 42 of the TF 40.

In the writing device 100, the deflectors in a plurality of stages are used to perform a writing process for each of the stripe regions 20. Here, for example, deflectors in three stages, namely, the main deflector 208, the sub-deflector 209, and the sub-sub-deflector 216, are used. For example, writing is performed for a 1st stripe region 20 in the x direction during continuous movement of the XY stage 105 in an −x direction. After the end of writing to the 1st stripe region 20, writing is performed for a 2nd stripe region 20 similarly or in the opposite direction. Subsequently, writing is similarly performed for a 3rd stripe region 20 and the subsequent stripe regions 20.

The main deflector 208 sequentially deflects the electron beam 200 to the reference positions A of the SFs 30 so as to follow the movement of the XY stage 105. The sub-deflector 209 sequentially deflects the electron beam 200 from the reference position A of each SF 30 to the reference positions B of the TFs 40. The sub-sub-deflector 216 sequentially deflects the electron beam 200 from the reference position B of each TF 40 to each shot position 42 in the TF 40 to which the beam is emitted.

Accordingly, the main deflector 208, the sub-deflector 209, and the sub-sub-deflector 216 can control different amounts of deflection and have deflection regions of different sizes. Each TF 40 is controlled in accordance with the smallest amount of deflection among the amounts of deflection of the deflectors in the plurality of stages and is the smallest deflection region among the deflection regions of the deflectors.

As described above, to each deflector, the output voltage from the corresponding DAC amplifier is supplied. When each deflector is to be driven by the output voltage from the corresponding DAC amplifier, a settling time is set, and the beam is emitted to a deflection position after the elapse of the set settling time. As the settling time increases, an error in the amount of deflection decreases but throughput drops.

Figure 3:
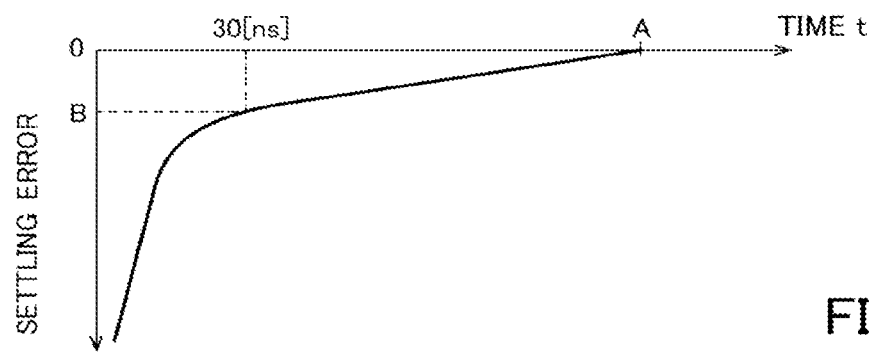
FIG. 3 is a graph showing example changes in a settling error over time.

FIG. 3 illustrates an example relationship between the time elapsed since application of a deflection voltage to the sub-deflector 209 (the time elapsed since the start of deflection) and an error in the amount of deflection (settling error) of the sub-deflector 209. It can be supposed that the settling error linearly changes in a range in which the settling error is small. In this example, it is assumed that the settling error changes linearly after the elapse of 30 ns.

The time at which the settling error decreases to zero is denoted by A, and the settling error upon the elapse of 30 ns is denoted by B. Then, a settling error $S_0(t)$ of the sub-deflector 209 at time t after the elapse of 30 ns can be expressed by, for example, expression (1) below.

$$S_0(t) = (t-30) \times \frac{B}{A-30} + B \qquad (1)$$

FIG. 4A illustrates changes in the settling error over time in a case where deflection starts at time T1 and the beam is deflected to the reference position of a specific TF 40 (a 1st TF 40). The settling time is denoted by $STL_1$, and the total shot time for this TF 40 is denoted by $Shot_1$. Then, the settling error for this TF 40 can be considered to be equal to a settling error E1 upon the elapse of $STL_1+Shot_1/2$ with reference to the deflection start time T1. The $STL_1+Shot_1/2$ time point corresponds to the midpoint of the period of shot. The settling error $X_1$ for the 1st TF 40 is expressed by, for example, expression (3) by using expression (2) below.

$$S_0^i(t) = -(t-30) \times \frac{B_i}{A_i - 30} + B_i \quad (2)$$

$$A_i = \Delta X_i \times GAIN_A + OFFSET_A$$

$$B_i = \Delta X_i \times GAIN_B + OFFSET_B$$

$$X_1 = S_0^1\left(STL_1 + \frac{Shot_1}{2}\right) \quad (3)$$

In the above expressions, $\Delta X_i$ denotes the amount of deflection of the sub-deflector 209. Each of Ai and Bi depends on the amount of deflection $\Delta X_i$ of the sub-deflector 209, and therefore, can be expressed by a linear equation using parameters $GAIN_A$, $OFFSET_A$, $GAIN_B$, and $OFFSET_B$. The parameters $GAIN_A$, $OFFSET_A$, $GAIN_B$, and $OFFSET_B$ can be determined such that, for example, when a plurality of evaluation patterns are written to an evaluation substrate while the conditions of the settling time and the shot time are changed, the sum of squares of the differences (the differences 3σ) between the writing results and the calculated values for all conditions is smallest.

FIG. 4B illustrates changes in the settling error over time in a case where the beam is deflected to the reference position of the next TF 40 (a 2nd TF 40) at time T2. The settling time is denoted by $STL_2$, and the total shot time for this TF 40 is denoted by $Shot_2$. Then, the settling error for this TF 40 is equal to the sum of a settling error E2 upon the elapse of $STL_2+Shot_2/2$ with reference to time T2 and a settling error R1 upon the elapse of $STL_1+Shot_1+STL_2+Shot_2/2$ with reference to time T1.

The settling error R1 upon the elapse of $STL_1+Shot_1+STL_2+Shot_2/2$ with reference to time T1 is the residual in the settling error for the 1st TF 40. The settling error $X_2$ for the 2nd TF 40 is expressed by expression (4) below.

$$X_2 = S_0^2\left(STL_2 + \frac{Shot_2}{2}\right) + S_0^1\left(STL_1 + Shot_1 + STL_2 + \frac{Shot_2}{2}\right) \quad (4)$$

Accordingly, when the residual in the settling error for the TF 40 to which a beam was shot in the past is added in addition to the settling error for the TF 40 to which a beam is shot, a shift in the beam deflection position can be precisely estimated.

For example, when a beam is shot to an n-th TF 40 and the effect of residuals in settling errors for the previous six TFs 40, namely, n−1-th to n−6-th TFs 40, is taken into consideration, the settling error $X_n$ is expressed by expression (5) below.

$$X_n = S_0^n\left(STL_n + \frac{Shot_n}{2}\right) + S_o^{n-1}\left(STL_{n-1} + Shot_{n-1} + STL_n + \frac{Shot_n}{2}\right) + \\ \ldots + S_0^{n-6}\left(\sum_{i=1}^6 (STL_{n-i} + Shot_{n-i}) + STL_n + \frac{Shot_n}{2}\right) \quad (5)$$

Data of the computational expression (2) for calculating the amount of position shift due to a settling error as described above is stored in advance in the storage unit 142. Note that relation information for calculating the amount of position shift need not be the computational expression but needs to be information indicating a relationship between the elapsed time and the amount of position shift for calculating the amount of position shift.

FIG. 5 is a flowchart for explaining a writing method according to this embodiment. In a shot data generation step (step S101), the shot data generation unit 50 performs data conversion processes in a plurality of stages for write data stored in the storage unit 140, divides each shape pattern that is a write target into shot shapes having such sizes that each shot shape can be irradiated with a single shot, and generates shot data that is used as a format specific to the writing device. As the shot data, for each shot, for example, a shape code indicating the shape type of each shot shape, the shape size, the write position, and so on are defined.

In a shot time/settling time calculation step (step S102), the write control unit 54 calculates a shot time Shot for each TF 40 from the shot data for each shot. The write control unit 54 obtains the amount of deflection to the reference position by the sub-deflector 209 for each TF 40 and calculates the settling time STL of the DAC amplifier 132 on the basis of the amount of deflection. The write control unit 54 increases the settling time STL as the amount of deflection by the sub-deflector 209 increases and as the output voltage of the DAC amplifier 132 increases. For example, an expression expressing a relationship between the amount of deflection by the sub-deflector 209 and a desirable settling time is prepared in advance, and the write control unit 54 calculates the settling time by using this expression.

In an amount-of-position-shift calculation step (step S103), the shot position correction unit 52 calculates the amount of shot position shift due to a settling error for each of the plurality of TFs 40 in the SF 30. The shot position correction unit 52 substitutes the amount of deflection by the sub-deflector 209, the settling time, and the shot time corresponding to the n-th TF 40, and the amount of deflection by the sub-deflector 209 corresponding to each of the n−1-th to n−k-th (k is an integer greater than or equal to 1) TFs 40 and the time elapsed since the start of deflection by applying a voltage to the sub-deflector 209 into the computational expression retrieved from the storage unit 142 and adds up the results of calculation to thereby calculate the amount of shot position shift in the n-th TF 40.

For example, in a case of taking into consideration the effect of residuals in settling errors for the previous six TFs 40, the write control unit 54 adds up a value obtained by substituting the amount of deflection by the sub-deflector 209, the settling time, and the shot time corresponding to the n-th TF 40 into the computational expression and a value obtained by substituting the amount of deflection by the sub-deflector 209 corresponding to each of the n−1-th to n−6-th TFs 40 and the time elapsed since the start of deflection by applying a voltage to the sub-deflector 209 into the computational expression to thereby calculate the amount of shot position shift in the n-th TF 40.

In a position correction step (step S104), the shot position correction unit 52 obtains a position calculated by subtracting from a write position indicated by coordinates and designed for each shot, the amount of shot position shift, calculated in step S103, in the TF 40 to which the shot belongs, as a corrected write position.

In a writing step (step S105), a writing process is performed by using the shot data for which the shot position has been corrected by the shot position correction unit 52. The write control unit 54 outputs the corrected write position to the deflection control circuit 120 for each shot. The deflection control circuit 120 calculates deflection data for writing to the corrected position.

The deflection control circuit 120 outputs deflection data, with which an irradiation time for a necessary amount of irradiation is attained, to the DAC amplifier 130 for the blanking deflector 212. The deflection control circuit 120 outputs deflection data to the DAC amplifier 134 for the main deflector 208 such that the beam follows the movement of the XY stage 105. The deflection control circuit 120 outputs deflection data to the DAC amplifier 132 for the sub-deflector 209 that deflects the beam to a relative position in each SF 30. The deflection control circuit 120 outputs deflection data to the DAC amplifier 136 for the sub-sub-deflector 216 that deflects the beam to a relative position in each TF 40. The deflection control circuit 120 outputs deflection data to the DAC amplifier 138 for the shaping deflector 205 such that the beam is in a desired shape.

When the electron beam 200 emitted from the electron gun 201 (emission unit) passes through the blanking deflector 212, the blanking deflector 212 makes the electron beam 200 pass through the blanking aperture plate 214, for example, in a beam ON state and deflects the electron beam 200 such that the entire beam is blocked by the blanking aperture plate 214 in a beam OFF state. The electron beam 200 that passes through the blanking aperture plate 214 during the period from when the state transitions from the beam OFF state to the beam ON state to when the state subsequently transitions to the beam OFF state is a single electron-beam shot.

The electron beam 200 in each shot generated as a result of passing through the blanking deflector 212 and the blanking aperture plate 214 illuminates the entire first shaping aperture plate 203 having a rectangular hole by the illumination lens 202. Here, the electron beam 200 is first shaped so as to have a rectangular shape.

The electron beam 200 passing through the first shaping aperture plate 203 and forming a first aperture image is projected onto the second shaping aperture plate 206 by the projection lens 204. When the first aperture image on the second shaping aperture plate 206 is subjected to deflection control by the shaping deflector 205, the beam shape and the dimensions can be changed (variable shaping is performed). Such variable shaping is performed for each shot, and the beam can be shaped so as to have a different beam shape and different dimensions from shot to shot.

The electron beam 200 passing through the second shaping aperture plate 206 and forming a second aperture image is focalized by the objective lens 207, deflected by the main deflector 208, the sub-deflector 209, and the sub-sub-deflector 216, and emitted to a desired position on the target object 101 disposed on the continuously moving XY stage 105. Accordingly, a plurality of shots of the electron beam 200 are sequentially deflected by the deflectors onto the target object 101 that forms a substrate.

As described above, with this embodiment, the amount of shift in the shot position is obtained by taking into consideration not only a settling error for the TF 40 to which the beam is shot but also residuals in settling errors for the TFs 40 for each of which the beam has been shot, and the amount of shift is subtracted from the designed write position indicated by coordinates to thereby correct the write position. Accordingly, it is possible to decrease a settable settling time, increase throughput, and attain a high precision of writing.

An example has been described in the above-described embodiment in which when the amount of shot position shift in the n-th TF 40 in one SF 30 due to a settling error is calculated, residuals in settling errors in the n−1-th to n−k-th TFs 40 are taken into consideration. Here, the value of "k" may be a fixed value or a variable value. For example, residuals in settling errors for all TFs 40, in the same SF 30, for each of which the beam has been shot may be taken into consideration.

For example, in a case where 225 (=15×15) TFs 40 are included in one SF 30 and when the amount of shot position shift in a 5th TF 40 due to a settling error is calculated, residuals in settling errors for the 1st to 4th TFs 40 are taken into consideration. When the amount of shot position shift in a 20th TF 40 due to a settling error is calculated, residuals in settling errors for the 1st to 19th TFs 40 are taken into consideration. When the amount of shot position shift in a 225th TF 40 due to a settling error is calculated, residuals in settling errors for the 1st to 224th TFs 40 are taken into consideration. As a writing process for one SF 30 advances, a computational load for calculating the amount of shot position shift increases, but the amount of shot position shift can be calculated further precisely.

When the amount of shot position shift in an n-th SF 30 in one main deflection region due to a settling error is calculated with a technique similar to that described in the above-described embodiment, residuals in settling errors for n−1-th to n−k-th SFs 30 may be taken into consideration.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing device for sequentially writing patterns to a plurality of deflection positions on a target object by deflecting a charged particle beam by a deflector, the charged particle beam writing device comprising:
    a shot data generator converting write data to shot data that includes shot positions to which and shot times for which the charged particle beam is shot;
    a storage storing relation information indicating a relationship between a time elapsed since a start of deflection by the deflector and an amount of position shift in a shot position to which the charged particle beam is shot;
    a shot position corrector obtaining a first amount of position shift corresponding to an n-th (where n is an integer greater than or equal to 2) deflection position in sequential pattern writing, by using a settling time and a shot time of the deflector and the relation information, obtaining a second amount of position shift corresponding to an n−1-th deflection position by using the time elapsed since the start of deflection and the relation information, obtaining an amount of position correction by adding up the first amount of position shift and the second amount of position shift, and correcting a shot position, for the n-th deflection position, defined by the shot data based on the amount of position correction; and a writer emitting the charged particle beam to the n-th deflection position by using the shot data for which the shot position has been corrected, and writing a pattern.

2. The device according to claim 1, wherein the n is an integer greater than or equal to 3, and
the shot position corrector obtains a third amount of position shift corresponding to up to an n−k-th (where k is an integer greater than or equal to 2 and less than n) deflection position in the sequential pattern writing, by using the time elapsed since the start of deflection and the relation information, and obtains the amount of position correction by adding up the first amount of position shift, the second amount of position shift, and the third amount of position shift.

3. The device according to claim 1, wherein the deflector includes deflectors, in a plurality of stages, having different amounts of deflection.

4. The device according to claim 3, wherein
the deflectors include
a first deflector deflecting the charged particle beam to a reference position in each of a plurality of first sub-regions obtained by virtually dividing a write region of the target object in a mesh form,
a second deflector deflecting the charged particle beam from the reference position in each first sub-region to a reference position in each of a plurality of second sub-regions obtained by virtually dividing the first sub-region in a mesh form, and
a third deflector deflecting the charged particle beam from the reference position in each second sub-region to a shot position in the second sub-region to which the charged particle beam is shot,
the storage stores relation information indicating a relationship between a time elapsed since a start of deflection by the second deflector as the time elapsed since the start of deflection and an amount of position shift in a shot position to which the charged particle beam is shot, and
the shot position corrector obtains the first amount of position shift corresponding to an n-th (where n is an integer greater than or equal to 2) reference position of the second sub-region, which is the n-th deflection position by using a settling time and a shot time of the second deflector and the relation information, obtains the second amount of position shift corresponding to an n−1-th reference position of the second sub-region, which is the n−1-th deflection position by using the time elapsed since the start of deflection and the relation information, obtains an amount of position correction by adding up the first amount of position shift and the second amount of position shift, and corrects a shot position, in the n-th second sub-region, defined by the shot data based on the amount of position correction.

5. The device according to claim 4, wherein the n is an integer greater than or equal to 3, and
the shot position corrector obtains a third amount of position shift corresponding to an n−k-th (where k is an integer greater than or equal to 2 and less than n) reference position of the second sub-region, which is the n−k-th deflection position by using the time elapsed since the start of deflection and the relation information, and obtains the amount of position correction by adding up the first amount of position shift, the second amount of position shift, and the third amount of position shift.

6. A charged particle beam writing method for sequentially writing patterns to a plurality of deflection positions on a target object by deflecting a charged particle beam by a deflector, the charged particle beam writing method comprising:
converting write data to shot data that includes shot positions to which and shot times for which the charged particle beam is shot;
obtaining a first amount of position shift corresponding to an n-th (where n is an integer greater than or equal to 2) deflection position in sequential pattern writing, by using a settling time and a shot time of the deflector and relation information obtained in advance and indicating a relationship between a time elapsed since a start of deflection by the deflector and an amount of position shift in a shot position to which the charged particle beam is shot;
obtaining a second amount of position shift corresponding to an n−1-th deflection position in the sequential pattern writing, by using the time elapsed since the start of deflection and the relation information;
obtaining an amount of position correction by adding up the first amount of position shift and the second amount of position shift, and correcting a shot position, for the n-th deflection position, defined by the shot data based on the amount of position correction; and
emitting the charged particle beam to the n-th deflection position by using the shot data for which the shot position has been corrected, and writing a pattern.

7. The method according to claim 6, wherein the n is an integer greater than or equal to 3, and
a third amount of position shift corresponding to up to an n−k-th (where k is an integer greater than or equal to 2 and less than n) deflection position in the sequential pattern writing is obtained by using the time elapsed since the start of deflection and the relation information, and the amount of position correction is obtained by adding up the first amount of position shift, the second amount of position shift, and the third amount of position shift.

8. The method according to claim 6, wherein
the charged particle beam is deflected by a first deflector to a reference position in each of a plurality of first sub-regions obtained by virtually dividing a write region of the target object in a mesh form,
the charged particle beam is deflected by a second deflector from the reference position in each first sub-region to a reference position in each of a plurality of second sub-regions obtained by virtually dividing the first sub-region in a mesh form,
the charged particle beam is deflected by a third deflector from the reference position in each second sub-region to a shot position in the second sub-region to which the charged particle beam is shot,
relation information is stored in a storage, the relation information indicating a relationship between a time elapsed since a start of deflection by the second deflector as the time elapsed since a start of deflection by the deflector and an amount of position shift in a shot position to which the charged particle beam is shot, and
the first amount of position shift corresponding to an n-th (where n is an integer greater than or equal to 2) reference position of the second sub-region, which is the n-th deflection position obtained by using a settling time and a shot time of the second deflector and the relation information, the second amount of position shift corresponding to an n−1-th reference position of the second sub-region, which is the n−1-th deflection position obtained by using the time elapsed since the start of deflection and the relation information, an amount of position correction is obtained by adding up the first amount of position shift and the second amount of position shift, and a shot position, in the n-th reference position of the second sub-region, defined by the shot data is corrected based on the amount of position correction.

9. The method according to claim 8, wherein the n is an integer greater than or equal to 3, a third amount of position shift corresponding to an n−k-th reference position of the second sub-region, which is an n−k-th deflection position obtained by using the time elapsed since the start of deflection and the relation information, and the amount of position correction is obtained by adding up the first amount of position shift, the second amount of position shift, and the third amount of position shift.

* * * * *